United States Patent [19]

Rao

[11] Patent Number: 4,588,961
[45] Date of Patent: May 13, 1986

[54] AMPLIFIER WITH EXTENDED OUTPUT DRIVE CAPABILITY

[75] Inventor: Madana K. N. Rao, North Plainfield, N.J.

[73] Assignee: AT&T Bell Laboratories, Murray Hill, N.J.

[21] Appl. No.: 644,119

[22] Filed: Aug. 24, 1984

[51] Int. Cl.⁴ .............................................. H03F 3/26
[52] U.S. Cl. .................................... 330/267; 330/263; 330/288
[58] Field of Search ............................... 323/315, 316; 330/207 P, 255, 257, 262, 263, 288, 298, 267

[56] References Cited

U.S. PATENT DOCUMENTS

| | | | |
|---|---|---|---|
| 3,952,257 | 4/1976 | Schade, Jr. | 330/288 |
| 4,380,740 | 4/1983 | Kaplan | 330/288 |
| 4,394,625 | 7/1983 | Sakai | 330/267 |
| 4,410,857 | 10/1983 | Olmstead | 330/253 |
| 4,454,479 | 6/1984 | Spires | 330/263 |

OTHER PUBLICATIONS

U.S. Patent Application entitled "Operational Amplifier with Improved Output Capability," D. A. Spires, Ser. No. 451,024, filed Dec. 20, 1982.

Primary Examiner—Eugene R. Laroche
Assistant Examiner—Steven J. Mottola
Attorney, Agent, or Firm—Charles Scott Phelan

[57] ABSTRACT

An operational amplifier is provided with at least one output supplementary stage and current mirror amplifiers for coupling amplified signal current variations to drive supplementary output stage source and sink transistors. Those transistors have their internal collector-emitter paths directly connected between supply rails and perform further amplification of the signals. A current source circuit is employed for so limiting those signal current variations that, after the further amplification, circuit devices will not be damaged.

8 Claims, 1 Drawing Figure

4,588,961

AMPLIFIER WITH EXTENDED OUTPUT DRIVE CAPABILITY

TECHNICAL FIELD

This invention relates to amplifier output stages, and it relates in particular to output stages therefor which efficiently utilize the dynamic voltage range available from a power supply.

BACKGROUND OF THE INVENTION

Operational amplifiers are one class of amplifiers that are widely used building blocks in electronic circuit systems. A typical basic operational amplifier includes a differential amplifier input stage, a gain stage, and a class AB output stage comprising source and sink transistors controlling current through an output terminal. Such a building block amplifier is usually combined with a feedback network to adapt the combination to perform a desired one of many possible linear circuit functions.

As the physical size of electronic circuits gets smaller with advances in the art, the typical power supply voltage also becomes smaller; and a need arises to derive the maximum possible voltage and current output from the amplifier. In the past, attempts to achieve a maximum current range have resulted in either a low voltage output or an undue increase in the quiescent power dissipation.

In a L. A. Kaplan U.S. Pat. No. 4,380,740, cascaded current mirror amplifiers employ matched transfer characteristic master and slave transistors of different base-emitter junction areas. This arrangement achieves current gain independently of transistor beta.

O. H. Schade, Jr., U.S. Pat. No. 3,952,257, shows a current proportioning, or splitting, circuit using a current mirror amplifier (CMA) and employing transistor geometry ratios to achieve desired current splitting. Schade also arranges his circuit so that the potential at a load resistor terminal, without saturating an output transistor, can approach within one transistor base-emitter junction voltage drop (Vbe) plus one voltage drop across the collector-emitter path of a saturated, load driving transistor.

A copending, commonly owned, U.S. patent application of D. A. Spires Ser. No. 451,024, filed Dec. 20, 1982, now U.S. Pat. No. 4,454,479, entitled "Operational Amplifier with Improved Output Capability," and issued June 12, 1985, has cross-coupled CMAs and matched resistors coupled to base terminals of output transistors, of enlarged base-emitter junction area, to control their levels of conduction with respect to the output terminal. Since the output stage has essentially infinite drive capability, a current limiting stage with feedback to the amplifier second stage input prevents self-destruction in the event the load becomes shorted.

SUMMARY OF THE INVENTION

An amplifier output current range is increased by adding to a first output stage a current mirror circuit for voltage level shifting the amplified current from that output stage to drive a further output stage in which additional current amplification is performed.

In one embodiment of the invention, maximum current in the further stage is limited by current-source limiting input current to the further stage.

BRIEF DESCRIPTION OF THE DRAWING

A more complete understanding of the invention and its various features, objects, and advantages can be obtained from a consideration of the following detailed description in conjunction with the appended claims and the attached single FIGURE of the drawing which comprises a schematic diagram of an amplifier utilizing the invention.

DETAILED DESCRIPTION

Figure 1:
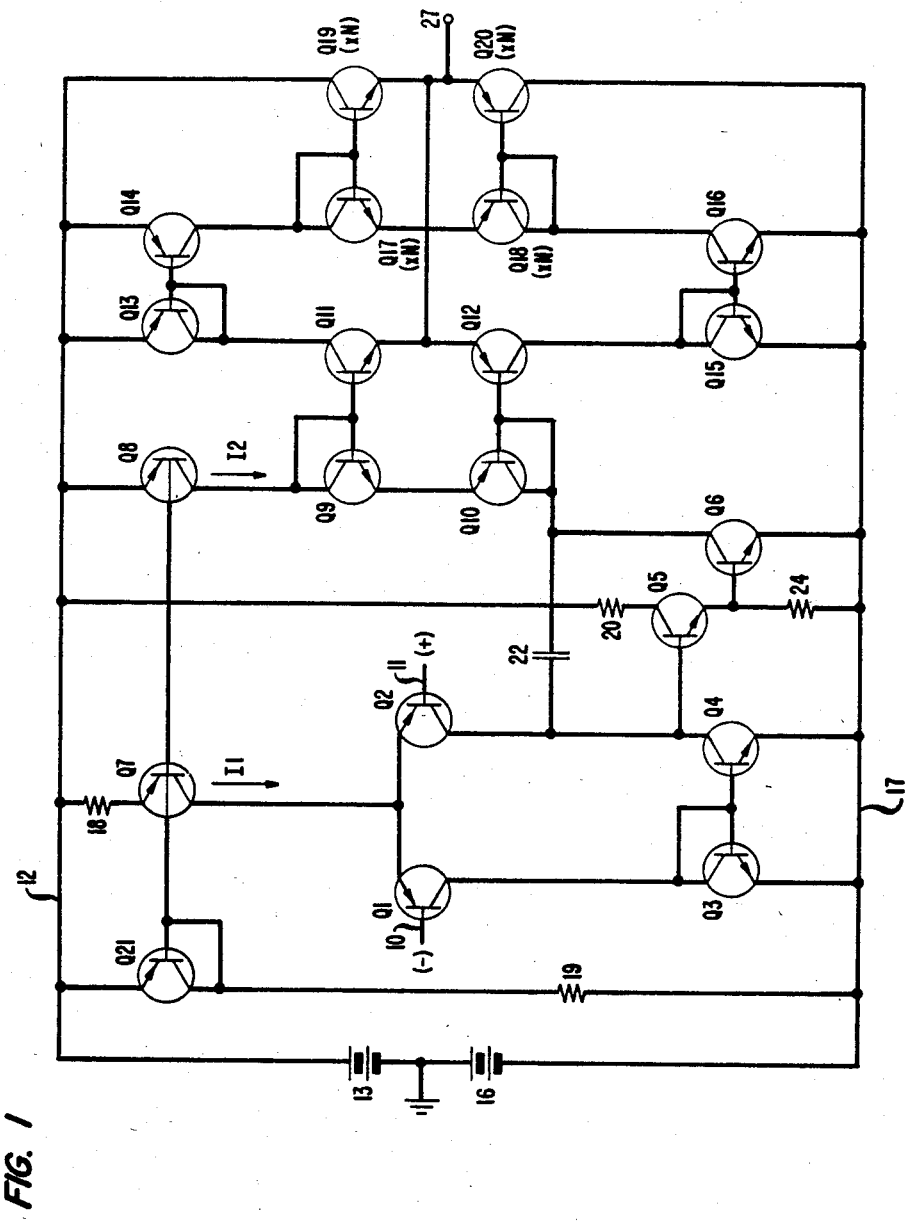

In the illustrative embodiment in the drawing, an operational amplifier receives input signals at inverting and noninverting input terminals 10 and 11, respectively. Those terminals are base terminals of pnp transistors Q1 and Q2, respectively, which are connected in a differential amplifier circuit configuration. The overall operational amplifier is powered by two nominally equal-valued batteries 13 and 16 connected across the positive and negative rails viz., 12 and 17 respectively; the nove common to the batteries is the ground or the reference terminal. Rails 12 and 17 are advantageously at plus and minus five volts, respectively. Transistors Q1 and Q2 are biased by connection of their emitter terminals to the positive rail 12 by way of a current-source-connected pnp transistor Q7 having its emitter connected through a resistor 18 to the rail 12. Conduction level of transistor Q7 is set by resistors 18 and 19 and a diode-connected transistor Q21. Transistor Q21 is a pnp type and has its commonly connected base and collector terminals connected to the base of transistor Q7. Collector terminals of transistors Q1 and Q2 are connected to the negative rail 17 by way of a current mirror amplifier (CMA) including a master transistor Q3 in series with transistor Q1 and a slave transistor Q4 in series with transistor Q12. The CMA converts the differential input signals to a single ended signal for driving subsequent stages.

Transistors Q1 and Q2 are advantageously matched in characteristics by, for example, being formed in the same integrated circuit chip. Other transistors are also hereinafter identified as being similarly matched, and transistors Q3 and Q4 are such another matched pair.

An output current from the operational amplifier differential input stage is derived at the collector terminal of transistor Q4 and directly fed to a base terminal of an npn transistor Q5 in a second stage, called a gain stage, of the amplifier. A collector terminal of transistor Q5 is connected to rail 12 by way of a resistor 20 to prevent excess power dissipation in the transistor. The emitter terminal of transistor Q5 is connected to rail 17 by a resistor 24 selected to assure adequate quiescent current in the transistor since transistor Q6 base current requirements are relatively modest. Transistor Q6 has its internal collector-emitter path connected in series in a current control circuit including in series a current-source-connected pnp transistor Q8 and two diode-connected, complementary conductivity type transistors Q9 and Q10. Transistors Q21, Q7, and Q8 are advantageously matched. A capacitor 22 is connected between the collector of transistor Q4 and the collector of Q6 to establish a dominant pole type of frequency response for the amplifier.

Transistor Q8 conduction level is set in the same way as that of transistor Q7 by way of a connection from the base-collector connection of transistor Q21. That level is, as will be seen, the determinative factor for the maximum output current level for the overall operational amplifier. Collector current I2 in transistor Q8 is selected to assure at least a predetermined minimum output current from the overall amplifier for the minimum betas of intervening transistors and assure no more than a predetermined maximum output current for the maximum betas of intervening transistors.

Transistors Q9 and Q10 are npn and pnp transistors, respectively; and they are employed to bias transistors Q11 and Q12 slightly above their conduction thresholds, i.e., for class AB, or push-pull, operation. That bias is applied by direct wire connections from the collector-base terminals of transistors Q9 and Q10 to base terminals of transistors Q11 and Q12. Transistors Q9 and Q11 are advantageously matched, as are transistors Q10 and Q12. The emitters of transistors Q11 and Q12 are connected to an output terminal 27. Thus, transistors Q11 and Q12 comprise a first push-pull amplification output stage.

As input signals are applied to input terminals 10 and 11, they cause corresponding variations in the level of conduction of transistor Q6 in a manner well known in the art. However, since output current from current source transistor Q8 is fixed, the current variations must be accommodated by diverting current into transistor Q11 and terminal 27 when transistor Q6 conduction goes low and pulling current from terminal 27 and transistor Q12 when transistor Q6 conduction goes high. The maximum current output that can be sourced from Q11 is approximately the product of beta of transistor Q11 and the fixed current I2 from the collector of transistor Q8. I2 flows at all times and is called a quiescent current. It is normally assigned as low a value as possible to keep quiescent power dissipation low. The maximum sinking current in transistor Q12 is approximately the products of the betas of transistors Q5, Q6, and Q12 and the current I1 from the collector of transistor Q7. I1 is also fixed by a current source, namely transistor Q7, at a level to minimize quiescent power dissipation and prevent device damage in amplifier output circuits.

It is sometimes attempted to increase amplifier current by substituting Darlington circuits for transistors Q11 and Q12. However, it can be shown that, although such a change increases current by an additional factor of beta, there is a corresponding reduction in the extent of voltage swing by an additional Vbe in each direction. This reduction is typically only 0.7 volt in each direction but it is a serious loss in systems operating on low supply voltages such as the 5-volt supply illustratively employed herein, Accordingly, the illustrative embodiment increases the maximum current swing for the whole amplifier, by connecting additional circuits to increase the sourcing and sinking currents of the amplifier without reducing the dynamic voltage range of its output.

Internal collector-emitter paths of complementary conductivity type transistors Q11 and Q12 are connected in series with master transistors Q13 and Q15 of pnp and npn CMAs, respectively, between supply rails 12 and 17. Those CMAs mirror the collector currents of transistors Q11 and Q12 to their respective slave transistors Q14 and Q16 which are connected in series between rails 12 and 17 with a pair of complementary conductivity type, diode-connected transistors Q17 and Q18. Transistors Q13 and Q14 are matched, as are transistors Q15 and Q16.

Transistors Q17 and Q18 perform a voltage biasing function, as previously described for transistors Q9 and Q10, to cause a further pair of complementary conductivity type transistors Q19 and Q20 to operate in a class AB manner. In that mode of operation the latter transistors source and sink mirrored current at levels determined by the quiescent currents I1, I2 and the load current at the output terminal 27. Thus, transistors Q19 and Q20 comprise a second push-pull amplification output stage. Collector-emitter paths of transistors Q19 and Q20 are connected in series between rails 12 and 17, and transistors Q19 and Q20 are matched with transistors Q17 and Q18, respectively. Under quiescent conditions, transistors Q11 and Q12 and transistors Q19 and Q20 are biased barely at conduction level so that only a small quiescent current is input to and output from the CMAs of Q13, A14 and Q15, Q16.

Amplifier output current capability is enhanced in the Q19, Q20 output stage in response to current variations in transistors Q11 and Q12. The current paths extend through the CMAs Q13, Q14, and Q15, Q16 and finally throught the transistors Q19 and Q20 to the output terminal 27. Also, transistors Q11 and Q12 establish direct voltage paths from the gain stage to the output terminal.

Since transistors Q19 and Q20 carry the main output current, their physical sizes should be compatible with the maximum operating current in order to ensure satisfactory electrical characteristics and also keep thermal stress to a minimum. Transistors Q17 through Q20 are selected to have large base-emitter junction areas, e.g., larger by a factor N=10, than other transistors in the amplifier.

During amplifier operation, voltage at output terminal 27 can swing to within one Vbe (transistor Q19) drop plus one saturation Vce (transistor Q14) drop of positive rail 12. Similarly, that voltage can swing to within one Vbe (transistor Q20) drop plus one saturation Vce (transistor Q16) drop of the negative rail 17.

The extent of the enhanced current range of the amplifier is a function of the quiescent currents and betas of transistors. The maximum current that can be sourced at the output terminal is about I2 times the product of betas of Q11 and Q19. The maximum output sinking current is quite high and is approximately equal to I1 times the product of betas of Q5, Q6, Q12 and Q20. No additional provisions, e.g., current limiting feedback, is required at terminal 27; and amplifier circuits, such as the base terminal of transistor Q5, are operated independently of the overall amplifier output. The price of the enhanced current range is only a small additional quiescent current for the output stage transistors Q17 through Q20. Otherwise, the circuit requires relatively little silicon area compared to prior amplifiers of comparable capabilities.

If further amplifier drive capability is required, at least one additional supplementary output stage, like that of transistors Q13-Q20, is added by opening the collector leads of transistors Q19 and Q20 to receive the CMA master transistors thereof.

Although the invention has been described in connection with a particular embodiment thereof, it is to be understood that additional embodiments, applications, and modifications which will be apparent to those skilled in the art are included within the spirit and scope of the invention.

What is claimed is:

1. An amplifier having a first push-pull amplification output stage for controlling output current level in a first output current path therein between power supply rails and including an output terminal, said amplifier comprising means for mirroring current in said first output current path to produce a mirrored current, at least a second push-pull amplification output stage for controlling output current level in a second current path therein between said supply rails, said second current path including said output terminal, and means, responsive to said mirrored current, for current biasing said second amplification stage to produce further amplified current in said second current path and said output terminal.

2. The amplifier in accordance with claim 1 in which said current biasing means comprises essentially zero impedance connections between said mirroring means and an input of said second push-pull amplification stage.

3. The amplifier in accordance with claim 1 which comprises in addition means, responsive to input signals to said amplifier, for driving said first push-pull amplification stage, said driving means including current source means for limiting drive to said first push-pull amplification stage to a maximum level which is insufficient to cause amplified current in said second push-pull amplification stage output terminal which could damage components of said second push-pull amplification stage.

4. The amplifier in accordance with claim 3 in which said driving means includes input circuit means responsive to said input signals and independent of signals at said output terminal.

5. The amplifier in accordance with claim 1 in which said first and second amplification stages each includes complementary conductivity type transistors having collector-emitter paths connected in series in their respective current paths, said mirroring means comprises first and second current mirror amplifiers each including a master transistor and a slave transistor, said first amplification stage comprises means for connecting emitter-collector paths of said transistors thereof in series in the first output current path with emitter-collector paths of said master transistors of said current mirror amplifiers between said supply rails, and said biasing means comprises means for biasing said second amplification stage circuit transistors for quiescent operation just above conduction thresholds thereof to establish class AB operation, means for connecting said biasing means in series with said slave transistors between said supply rails, and means for directly applying, between base terminals of said second amplification stage transistors, a voltage difference developed across said biasing means in response to said mirrored current.

6. The amplifier in accordance with claim 5 in which said biasing means comprises first and second diode-connected transistors connected in series for forward conduction in the same direction as said slave transistors.

7. The amplifier in accordance with claim 6 in which said diode-connected transistors and transistors of said second amplification stage each has a base-emitter junction area much larger than base-emitter junction areas of other transistors in said amplifier to accommodate amplified current without device damage.

8. The amplifier in accordance with claim 5 in which said applying means comprises wire connections of such low impedance that the minimum voltage drop between said output terminal and either of said rails is a base-emitter junction drop of a transistor of said second amplification stage and a saturation collector-emitter drop of one of said slave transistors.

* * * * *